United States Patent
Burrows et al.

(10) Patent No.: US 7,976,631 B2
(45) Date of Patent: Jul. 12, 2011

(54) MULTI-GAS STRAIGHT CHANNEL SHOWERHEAD

(75) Inventors: Brian H. Burrows, San Jose, CA (US); Alexander Tam, Union City, CA (US); Ronald Stevens, San Ramon, CA (US); Kenric T. Choi, Santa Clara, CA (US); James D. Felsch, Santa Clara, CA (US); Jacob Grayson, Santa Clara, CA (US); Sumedh Acharya, Santa Clara, CA (US); Sandeep Nijhawan, Los Altos, CA (US); Lori D. Washington, Union City, CA (US); Nyi O. Myo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 654 days.

(21) Appl. No.: 11/873,132

(22) Filed: Oct. 16, 2007

(65) Prior Publication Data
US 2009/0098276 A1 Apr. 16, 2009

(51) Int. Cl.
C23C 16/00 (2006.01)
C23C 16/455 (2006.01)
H01L 21/306 (2006.01)
H01L 21/3065 (2006.01)

(52) U.S. Cl. .............. 118/715; 156/345.33; 156/345.34

(58) Field of Classification Search .............. 118/715; 156/345.33, 345.34
See application file for complete search history.

(56) References Cited

U.S. PATENT DOCUMENTS

| | | | | |
|---|---|---|---|---|
| 3,381,114 A * | 4/1968 | Nakanuma | ................. | 219/385 |
| 4,590,042 A * | 5/1986 | Drage | ................. | 422/186.06 |
| 5,273,588 A * | 12/1993 | Foster et al. | ................. | 118/723 E |
| 5,574,247 A * | 11/1996 | Nishitani et al. | ................. | 118/708 |
| 5,935,647 A * | 8/1999 | DeDontney et al. | ................. | 427/248.1 |
| 5,950,925 A * | 9/1999 | Fukunaga et al. | ................. | 239/132.3 |
| 5,958,140 A * | 9/1999 | Arami et al. | ................. | 118/725 |
| 6,050,506 A | 4/2000 | Guo et al. | | |
| 6,086,677 A | 7/2000 | Umotoy et al. | | |
| 6,245,192 B1 * | 6/2001 | Dhindsa et al. | ................. | 156/345.34 |

(Continued)

FOREIGN PATENT DOCUMENTS
WO 2006 123870 11/2006

OTHER PUBLICATIONS

PCT International Search Report and Written Opinion dated Dec. 16, 2008 for International Application No. PCT/US2006/080043.

(Continued)

*Primary Examiner* — Jeffrie R Lund
(74) *Attorney, Agent, or Firm* — Patterson & Sheridan, L.L.P.

(57) ABSTRACT

A method and apparatus that may be utilized for chemical vapor deposition and/or hydride vapor phase epitaxial (HVPE) deposition are provided. In one embodiment, a metal organic chemical vapor deposition (MOCVD) process is used to deposit a Group III-nitride film on a plurality of substrates. A Group III precursor, such as trimethyl gallium, trimethyl aluminum or trimethyl indium and a nitrogen-containing precursor, such as ammonia, are delivered to a plurality of straight channels which isolate the precursor gases. The precursor gases are injected into mixing channels where the gases are mixed before entering a processing volume containing the substrates. Heat exchanging channels are provided for temperature control of the mixing channels to prevent undesirable condensation and reaction of the precursors.

25 Claims, 13 Drawing Sheets

U.S. PATENT DOCUMENTS

| | | | | |
|---|---|---|---|---|
| 6,245,278 | B1 * | 6/2001 | Lausenhammer et al. | 264/328.1 |
| 6,289,842 | B1 | 9/2001 | Tompa | |
| 6,302,964 | B1 | 10/2001 | Umotoy et al. | |
| 6,508,197 | B1 * | 1/2003 | Omstead et al. | 118/715 |
| 6,599,367 | B1 * | 7/2003 | Nakatsuka | 118/715 |
| 6,884,296 | B2 * | 4/2005 | Basceri et al. | 118/715 |
| 6,921,437 | B1 | 7/2005 | DeDontney et al. | |
| 6,983,892 | B2 * | 1/2006 | Noorbakhsh et al. | 239/67 |
| 7,018,940 | B2 | 3/2006 | Dunham | |
| 7,104,476 | B2 | 9/2006 | Kim | |
| 7,674,352 | B2 * | 3/2010 | Bour et al. | 156/345.34 |
| 2002/0017243 | A1 * | 2/2002 | Pyo | 118/715 |
| 2003/0159653 | A1 * | 8/2003 | Dando et al. | 118/715 |
| 2004/0035358 | A1 * | 2/2004 | Basceri et al. | 118/715 |
| 2004/0060514 | A1 * | 4/2004 | Janakiraman et al. | 118/715 |
| 2004/0206305 | A1 * | 10/2004 | Choi et al. | 118/715 |
| 2005/0087131 | A1 * | 4/2005 | Shtein et al. | 118/715 |
| 2005/0092248 | A1 * | 5/2005 | Lee et al. | 118/715 |
| 2005/0217580 | A1 | 10/2005 | DeDontney et al. | |
| 2005/0251990 | A1 * | 11/2005 | Choi et al. | 29/558 |
| 2006/0021574 | A1 | 2/2006 | Armour et al. | |
| 2006/0057824 | A1 | 3/2006 | Araki et al. | |
| 2006/0137608 | A1 * | 6/2006 | Choi et al. | 118/715 |
| 2007/0148349 | A1 * | 6/2007 | Fukada | 427/248.1 |
| 2007/0163440 | A1 | 7/2007 | Kim et al. | |
| 2007/0240631 | A1 | 10/2007 | Nijhawan et al. | |
| 2007/0272154 | A1 * | 11/2007 | Amikura et al. | 118/719 |
| 2008/0020146 | A1 * | 1/2008 | Choi et al. | 427/446 |
| 2008/0124463 | A1 * | 5/2008 | Bour et al. | 427/255.28 |
| 2008/0166884 | A1 * | 7/2008 | Nelson et al. | 438/765 |
| 2008/0236495 | A1 * | 10/2008 | Tompa | 118/724 |
| 2008/0242085 | A1 * | 10/2008 | Fischer et al. | 438/680 |
| 2009/0047426 | A1 * | 2/2009 | Park et al. | 427/248.1 |
| 2009/0081815 | A1 * | 3/2009 | Yamashita et al. | 438/9 |
| 2009/0082983 | A1 * | 3/2009 | Yamashita et al. | 702/83 |
| 2009/0095221 | A1 * | 4/2009 | Tam et al. | 118/715 |
| 2009/0095222 | A1 * | 4/2009 | Tam et al. | 118/723 R |
| 2009/0098276 | A1 * | 4/2009 | Burrows et al. | 427/8 |
| 2009/0130858 | A1 * | 5/2009 | Levy | 438/765 |
| 2009/0162260 | A1 * | 6/2009 | Bera et al. | 422/186.04 |
| 2009/0162261 | A1 * | 6/2009 | Baera et al. | 422/186.04 |
| 2009/0162262 | A1 * | 6/2009 | Bera et al. | 422/186.04 |
| 2009/0178614 | A1 * | 7/2009 | Kasai et al. | 118/708 |
| 2009/0218314 | A1 * | 9/2009 | Davis et al. | 216/60 |
| 2010/0040768 | A1 * | 2/2010 | Dhindsa | 427/8 |
| 2010/0261340 | A1 * | 10/2010 | Nijhawan et al. | 438/478 |
| 2010/0273291 | A1 * | 10/2010 | Kryliouk et al. | 438/99 |
| 2011/0052833 | A1 * | 3/2011 | Hanawa et al. | 427/534 |
| 2011/0061595 | A1 * | 3/2011 | Nasman et al. | 118/724 |

OTHER PUBLICATIONS

First Office Action dated May 27, 2010 for Chinese Patent Application No. 200810170603.0.

* cited by examiner

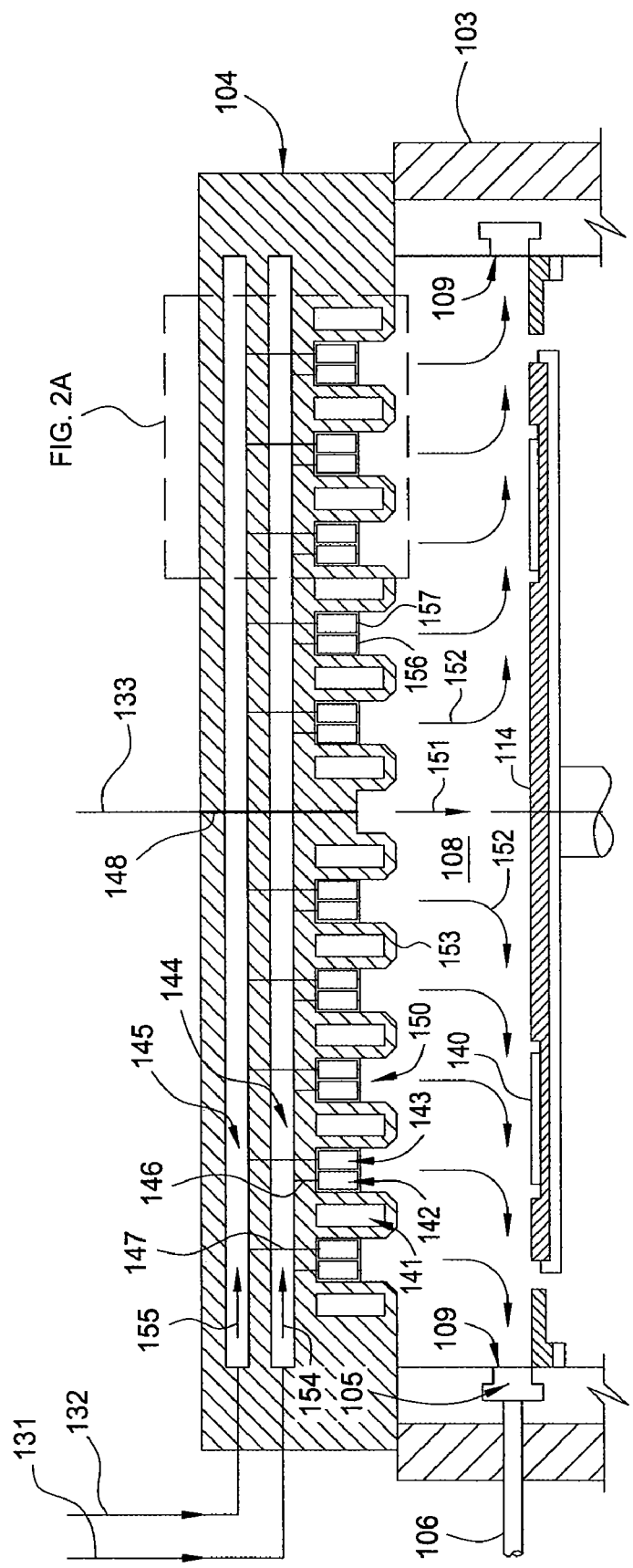

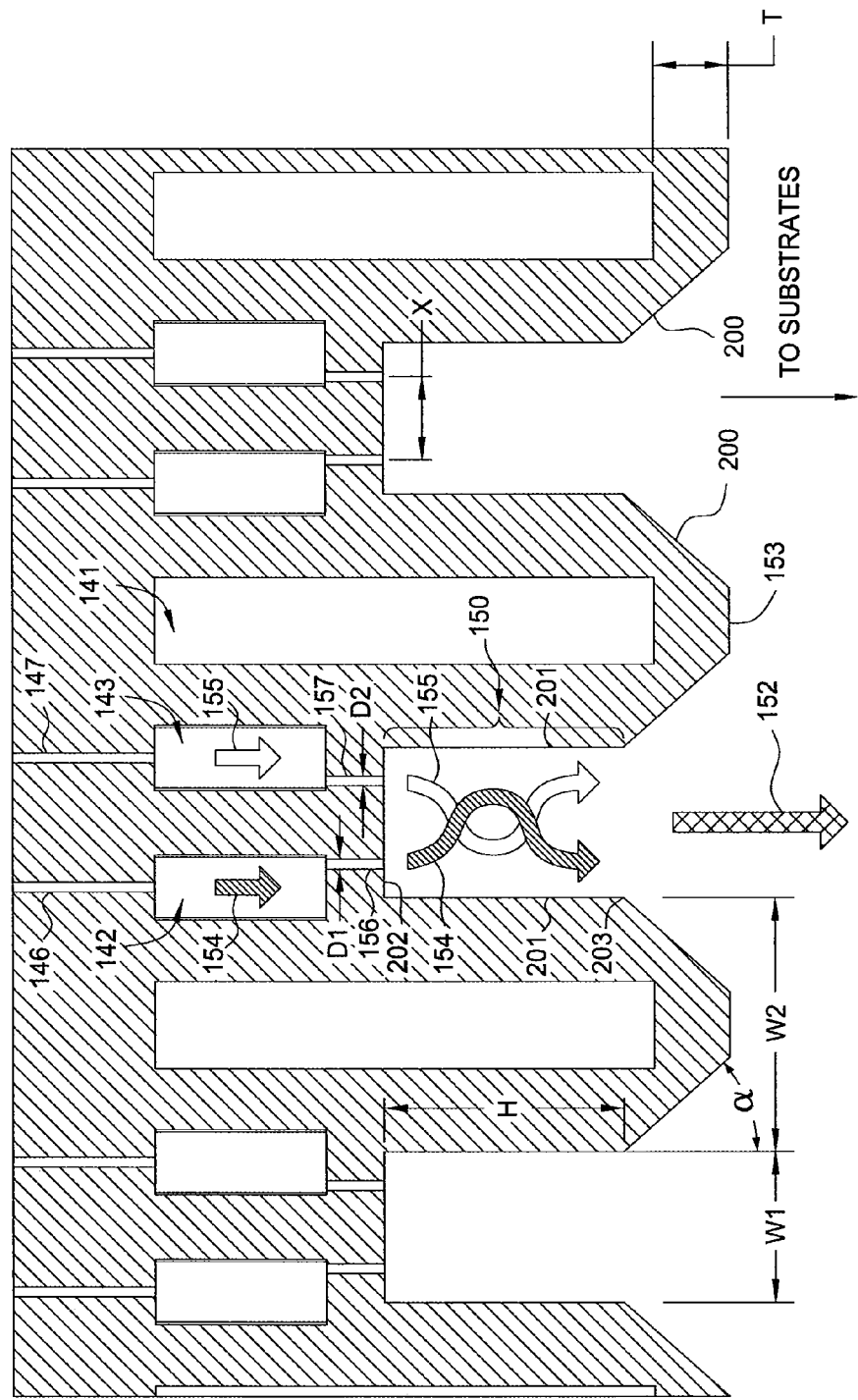

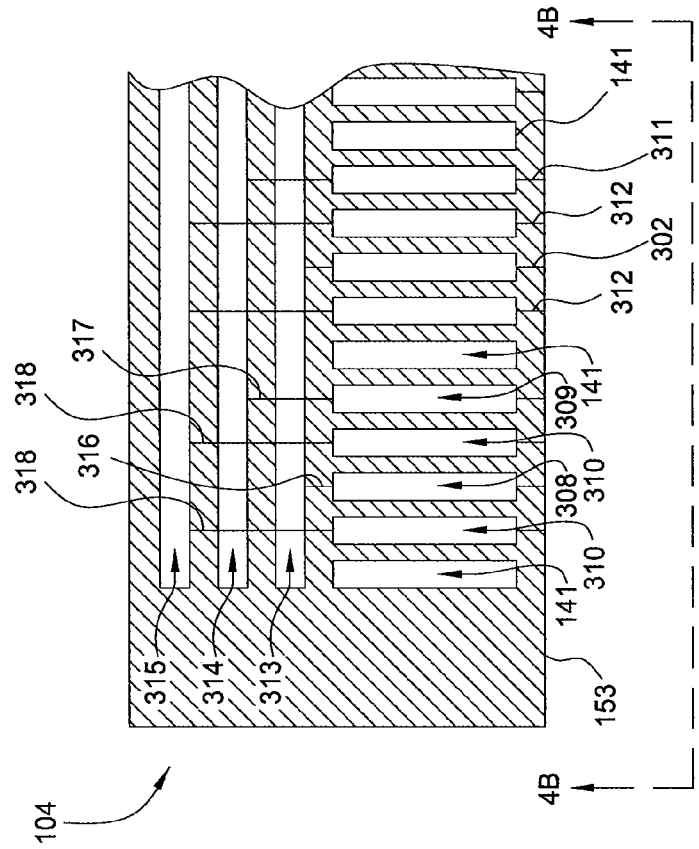
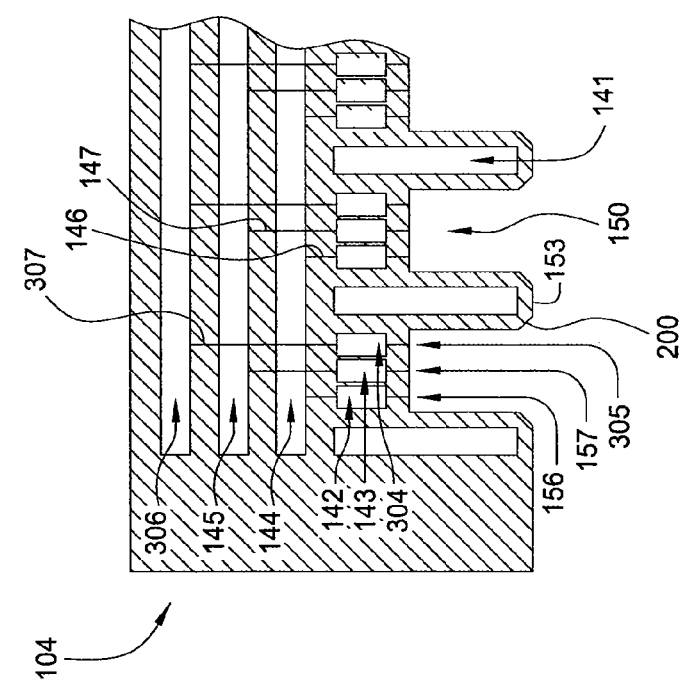
FIG. 3B
FIG. 3A

MULTI-GAS STRAIGHT CHANNEL SHOWERHEAD

BACKGROUND OF THE INVENTION

1. Field of the Invention

Embodiments of the present invention generally relate to methods and apparatus for chemical vapor deposition (CVD) on a substrate, and, in particular, to a showerhead design for use in metal organic chemical vapor deposition and/or hydride vapor phase epitaxy (HVPE).

2. Description of the Related Art

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate.

Multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the market place.

As the demand for LEDs, LDs, transistors, and integrated circuits increases, the efficiency of depositing high quality Group-III nitride films takes on greater importance. Therefore, there is a need for an improved deposition apparatus and process that can provide uniform precursor mixing and consistent film quality over larger substrates and larger deposition areas.

SUMMARY OF THE INVENTION

The present invention generally provides improved methods and apparatus for depositing Group III-nitride films using MOCVD and/or HVPE.

One embodiment provides a gas delivery apparatus for deposition on a substrate. The apparatus generally includes a plurality of straight and parallel gas flow channels for a first precursor gas and a plurality of straight and parallel gas flow channels for a second precursor gas, wherein the gas flow channels for the first precursor gas are parallel to the gas flow channels for the second precursor gas.

Another embodiment provides a gas delivery apparatus for deposition on a substrate. The apparatus generally includes a first gas flow channel, a second gas flow channel, a plurality of first gas injection holes in fluid communication with the first gas flow channel, a plurality of second gas injection holes in fluid communication with the second gas flow channel, and mixing channels disposed downstream from the first and the second gas injection holes for mixing a first gas injected through the first gas injection holes and a second gas injected through the second gas injection holes.

In yet another embodiment, a gas delivery apparatus for deposition on a substrate is disclosed. The apparatus comprises first gas flow channels, second gas flow channels, gas injection holes in fluid communication with each of the first and second gas flow channels, and heat exchanging channels disposed between the gas injection holes, and formed within walls that extend in the direction of the gas injection past the gas injection holes toward a substrate processing volume, wherein the exterior of the walls define mixing channels into which first gas and second gas are injected through the gas injection holes to be mixed therein.

In another embodiment, a gas delivery apparatus for deposition on a substrate is disclosed. The apparatus comprises first gas flow channels, second gas flow channels, and gas injection holes in fluid communication with each of the first and second gas flow channels, wherein the gas injection holes are arranged to define a plurality of substantially wedge shaped gas injection zones, each gas injection zone having gas injection holes for injecting a gas that is different from an adjacent gas injection zone.

In one embodiment, a method is disclosed for deposition on a substrate. The method comprises using a showerhead apparatus having a mixing zone, the method further comprising flowing first and second gases into channels formed in the showerhead, and injecting the first and second gases that are flowing in the channels into the mixing zone.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1B is a detailed view of the deposition chamber shown in FIG. 1A.

FIG. 2A is a detailed cross sectional view of the showerhead assembly shown in FIG. 1B according to one embodiment of the invention.

FIGS. 3A and 3B are cross sectional views of additional embodiments of a showerhead assembly according to the present invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
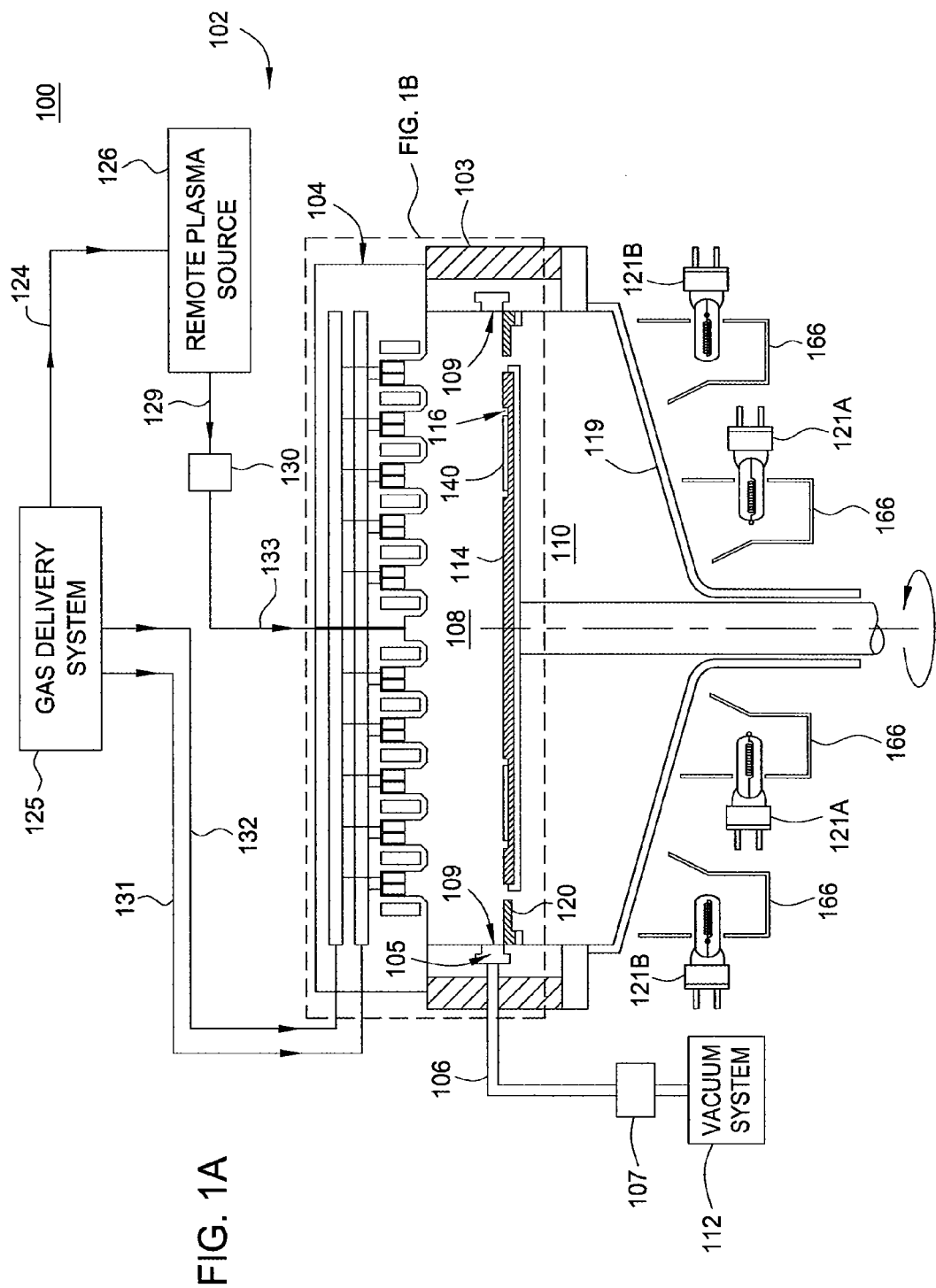
FIG. 1A is a schematic view of a deposition apparatus according to one embodiment of the invention.

Embodiments of the present invention generally provide a method and apparatus that may be utilized for deposition of Group III-nitride films using MOCVD and/or HVPE. FIG. 1A is a schematic view of a deposition apparatus that may be used to practice the invention according to one embodiment of the invention. Exemplary systems and chambers that may be adapted to practice the present invention are described in U.S. patent application Ser. Nos. 11/404,516, filed on Apr. 14, 2006, and Ser. No. 11/429,022, filed on May 5, 2006, both of which are incorporated by reference in their entireties.

The apparatus 100 shown in FIG. 1A comprises a chamber 102, a gas delivery system 125, a remote plasma source 126, and a vacuum system 112. The chamber 102 includes a chamber body 103 that encloses a processing volume 108. A showerhead assembly 104 is disposed at one end of the processing volume 108, and a substrate carrier 114 is disposed at the other end of the processing volume 108. A lower dome 119 is disposed at one end of a lower volume 110, and the substrate carrier 114 is disposed at the other end of the lower volume 110. The substrate carrier 114 is shown in process position, but may be moved to a lower position where, for example, the substrates 140 may be loaded or unloaded. An exhaust ring 120 may be disposed around the periphery of the substrate carrier 114 to help prevent deposition from occurring in the lower volume 110 and also help direct exhaust gases from the chamber 102 to exhaust ports 109. The lower dome 119 may be made of transparent material, such as high-purity quartz, to allow light to pass through for radiant heating of the substrates 140. The radiant heating may be provided by a plurality of inner lamps 121A and outer lamps 121B disposed below the lower dome 119, and reflectors 166 may be used to help control chamber 102 exposure to the radiant energy provided by inner and outer lamps 121A, 121B. Additional rings of lamps may also be used for finer temperature control of the substrates 140.

The substrate carrier 114 may include one or more recesses 116 within which one or more substrates 140 may be disposed during processing. The substrate carrier 114 may carry six or more substrates 140. In one embodiment, the substrate carrier 114 carries eight substrates 140. It is to be understood that more or less substrates 140 may be carried on the substrate carrier 114. Typical substrates 140 may include sapphire, silicon carbide (SiC), silicon, or gallium nitride (GaN). It is to be understood that other types of substrates 140, such as glass substrates 140, may be processed. Substrate 140 size may range from 50 mm-100 mm in diameter or larger. The substrate carrier 114 size may range from 200 mm-750 mm. The substrate carrier 114 may be formed from a variety of materials, including SiC or SiC-coated graphite. It is to be understood that substrates 140 of other sizes may be processed within the chamber 102 and according to the processes described herein. The showerhead assembly 104, as described herein, may allow for more uniform deposition across a greater number of substrates 140 and/or larger substrates 140 than in traditional MOCVD chambers, thereby increasing throughput and reducing processing cost per substrate 140.

The substrate carrier 114 may rotate about an axis during processing. In one embodiment, the substrate carrier 114 may be rotated at about 2 RPM to about 100 RPM. In another embodiment, the substrate carrier 114 may be rotated at about 30 RPM. Rotating the substrate carrier 114 aids in providing uniform heating of the substrates 140 and uniform exposure of the processing gases to each substrate 140.

The plurality of inner and outer lamps 121A, 121B may be arranged in concentric circles or zones (not shown), and each lamp zone may be separately powered. In one embodiment, one or more temperature sensors, such as pyrometers (not shown), may be disposed within the showerhead assembly 104 to measure substrate 140 and substrate carrier 114 temperatures, and the temperature data may be sent to a controller (not shown) which can adjust power to separate lamp zones to maintain a predetermined temperature profile across the substrate carrier 114. In another embodiment, the power to separate lamp zones may be adjusted to compensate for precursor flow or precursor concentration nonuniformity. For example, if the precursor concentration is lower in a substrate carrier 114 region near an outer lamp zone, the power to the outer lamp zone may be adjusted to help compensate for the precursor depletion in this region.

The inner and outer lamps 121A, 121B may heat the substrates 140 to a temperature of about 400 degrees Celsius to about 1200 degrees Celsius. It is to be understood that the invention is not restricted to the use of arrays of inner and outer lamps 121A, 121B. Any suitable heating source may be utilized to ensure that the proper temperature is adequately applied to the chamber 102 and substrates 140 therein. For example, in another embodiment, the heating source may comprise resistive heating elements (not shown) which are in thermal contact with the substrate carrier 114.

A gas delivery system 125 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 102. Different gases, such as precursor gases, carrier gases, purge gases, cleaning/etching gases or others may be supplied from the gas delivery system 125 to separate supply lines 131, 132, and 133 to the showerhead assembly 104. The supply lines 131, 132, and 133 may include shut-off valves and mass flow controllers or other types of controllers to monitor and regulate or shut off the flow of gas in each line.

A conduit 129 may receive cleaning/etching gases from a remote plasma source 126. The remote plasma source 126 may receive gases from the gas delivery system 125 via supply line 124, and a valve 130 may be disposed between the shower head assembly 104 and remote plasma source 126.

The valve 130 may be opened to allow a cleaning and/or etching gas or plasma to flow into the shower head assembly 104 via supply line 133 which may be adapted to function as a conduit for a plasma. In another embodiment, apparatus 100 may not include remote plasma source 126 and cleaning/etching gases may be delivered from gas delivery system 125 for non-plasma cleaning and/or etching using alternate supply line configurations to shower head assembly 104.

The remote plasma source 126 may be a radio frequency or microwave plasma source adapted for chamber 102 cleaning and/or substrate 140 etching. Cleaning and/or etching gas may be supplied to the remote plasma source 126 via supply line 124 to produce plasma species which may be sent via conduit 129 and supply line 133 for dispersion through showerhead assembly 104 into chamber 102. Gases for a cleaning application may include fluorine, chlorine or other reactive elements.

In another embodiment, the gas delivery system 125 and remote plasma source 126 may be suitably adapted so that precursor gases may be supplied to the remote plasma source 126 to produce plasma species which may be sent through showerhead assembly 104 to deposit CVD layers, such as III-V films, for example, on substrates 140.

A purge gas (e.g., nitrogen) may be delivered into the chamber 102 from the showerhead assembly 104 and/or from inlet ports or tubes (not shown) disposed below the substrate carrier 114 and near the bottom of the chamber body 103. The purge gas enters the lower volume 110 of the chamber 102 and flows upwards past the substrate carrier 114 and exhaust ring 120 and into multiple exhaust ports 109 which are disposed around an annular exhaust channel 105. An exhaust conduit 106 connects the annular exhaust channel 105 to a vacuum system 112 which includes a vacuum pump (not shown). The chamber 102 pressure may be controlled using a valve system 107 which controls the rate at which the exhaust gases are drawn from the annular exhaust channel 105.

FIG. 1B is a detailed view of the deposition chamber shown in FIG. 1A. The showerhead assembly 104 is located near the substrate carrier 114 during substrate 140 processing. In one embodiment, the distance from the showerhead face 153 to the substrate carrier 114 during processing may range from about 4 mm to about 40 mm. In one embodiment, the showerhead face 153 may comprise multiple surfaces of the showerhead assembly 104 which are approximately coplanar and face the substrates during processing.

During substrate 140 processing, according to one embodiment of the invention, process gas 152 flows from the showerhead assembly 104 towards the substrate 140 surface. The process gas 152 may comprise one or more precursor gases as well as carrier gases and dopant gases which may be mixed with the precursor gases. The draw of the annular exhaust channel 105 may affect gas flow so that the process gas 152 flows substantially tangential to the substrates 140 and may be uniformly distributed radially across the substrate 140 deposition surfaces in a laminar flow. The processing volume 108 may be maintained at a pressure of about 760 Torr down to about 80 Torr.

Reaction of process gas 152 precursors at or near the substrate 140 surface may deposit various metal nitride layers upon the substrate 140, including GaN, aluminum nitride (AlN), and indium nitride (InN). Multiple metals may also be utilized for the deposition of other compound films such as AlGaN and/or InGaN. Additionally, dopants, such as silicon (Si) or magnesium (Mg), may be added to the films. The films may be doped by adding small amounts of dopant gases during the deposition process. For silicon doping, silane ($SiH_4$) or disilane ($Si_2H_6$) gases may be used, for example, and a dopant gas may include Bis(cyclopentadienyl) magnesium ($Cp_2Mg$ or $(C_5H_5)_2Mg$) for magnesium doping.

In one embodiment, the showerhead assembly 104 comprises a first plenum 144, a second plenum 145, gas conduits 146, 147, first gas channels 142, second gas channels 143, heat exchanging channels 141, mixing channels 150, and a central conduit 148. The first and second gas channels 142, 143 may comprise a plurality of straight channels which are parallel to each other and have a plurality of first gas injection holes 156 and second gas injection 157 holes disposed at the bottom of and along the length of each channel. In one embodiment, the gas conduits 146, 147 may comprise quartz or other materials such as 316L stainless steel, Inconel®, Hastelloy®, electroless nickel plated aluminum, pure nickel, and other metals and alloys resistant to chemical attack.

The showerhead assembly 104 may receive gases via supply lines 131, 132, and 133. A first precursor gas 154 and a second precursor gas 155 flow through supply lines 131 and 132 into first and second plenums 144 and 145, and a non-reactive gas 151, which may be an inert gas such as hydrogen ($H_2$), nitrogen ($N_2$), helium (He), argon (Ar) or other gases and combinations thereof, may flow through supply line 133 coupled to a central conduit 148 which is located at or near the center of the showerhead assembly 104. The central conduit 148 may function as a central inert gas diffuser which flows a non-reactive gas 151 into a central region of the processing volume 108 to help prevent gas recirculation in the central region. In another embodiment, the central conduit 148 may carry a precursor gas.

In yet another embodiment, a cleaning and/or etching gas or plasma may be delivered through the central conduit 148 into the chamber 102. The central conduit 148 may adapted to disperse the cleaning and/or etching gas or plasma inside chamber 102 to provide more effective cleaning. In other embodiments, the apparatus 100 may be adapted to deliver cleaning and/or etching gas or plasma into chamber 102 through other routes, such as the first and second gas injection holes 156, 157. In one embodiment, a fluorine or chlorine based plasma may be used for etching or cleaning. In other embodiments, halogen gases, such as $Cl_2$, Br, and $I_2$, or halides, such as HCl, HBr, and HI, may be used for non-plasma etching.

In another embodiment, the central conduit 148 may function as a metrology port, and a metrology tool (not shown) may be coupled to the central conduit 148. The metrology tool may be used to measure various film properties, such as thickness, roughness, composition, or other properties. In another embodiment, the central conduit 148 may be adapted to function as a port for a temperature sensor, such as a pyrometer or thermocouple.

The first and second precursor gases 154, 155 flow from the first and second plenums 144, 145 into the gas conduits 146 and 147, which are in fluid communication with first and second gas channels 142 and 143. The first and second precursor gases 154, 155 flow from first and second gas channels 142, 143 into first and second gas injection holes 156, 157, and then into a mixing channel 150 where the first and second precursor gases 154, 155 mix to form process gas 152 which then flows into processing volume 108. In one embodiment, a carrier gas, which may comprise nitrogen gas ($N_2$) or hydrogen gas ($H_2$) or an inert gas, may be mixed with the first and second precursor gases 154, 155 prior to delivery to the showerhead assembly 104.

In one embodiment, the first precursor gas 154 which is delivered to first plenum 144 may comprise a Group III precursor, and second precursor gas 155 which is delivered to second plenum 145 may comprise a Group V precursor. In another embodiment, the precursor delivery may be switched so that the Group III precursor is routed to second plenum 145 and the Group V precursor is routed to first plenum 144. The choice of first or second plenum 144, 145 for a given precursor may be determined in part by the distance of the plenum from the heat exchanging channels 141 and the desired temperature ranges which may be maintained for each plenum and the precursor therein.

The Group III precursor may be a metal organic (MO) precursor such as trimethyl gallium ("TMG"), trimethyl aluminum ("TMAl"), and/or trimethyl indium ("TMI"), but other suitable MO precursors may also be used. The Group V precursor may be a nitrogen precursor, such as ammonia ($NH_3$). In one embodiment, a single MO precursor, such as TMG, may be delivered to either first or second plenum 144 or 145. In another embodiment, two or more MO precursors, such as TMG and TMI, may be mixed and delivered to either first or second plenum 144 or 145.

Adjacent to the first and second gas channels 142, 143 and mixing channels 150 are heat exchanging channels 141 through which may flow a heat exchanging fluid to help regulate the temperature of the showerhead assembly 104. Suitable heat exchanging fluids may include water, water-based ethylene glycol mixtures, a perfluoropolyether (e.g., Galden® fluid), oil-based thermal transfer fluids, or similar fluids. The heat exchanging fluid may be circulated through a heat exchanger (not shown) to raise or lower the temperature of the heat exchanging fluid as required to maintain the temperature of the showerhead assembly 104 within a desired temperature range. In one embodiment, the heat exchanging fluid may be maintained within a temperature range of about 20 degrees Celsius to about 120 degrees Celsius. In another embodiment, the heat exchanging fluid may be maintained within a temperature range of about 100 degrees Celsius to about 350 degrees Celsius. In yet another embodiment, the heat exchanging fluid may be maintained at a temperature of greater than 350 degrees Celsius. The heat exchanging fluid may also be heated above its boiling point so that the showerhead assembly 104 may be maintained at higher temperatures using readily available heat exchanging fluids. Also, the heat exchanging fluid may be a liquid metal, such as gallium or gallium alloy.

The flow rate of the heat exchanging fluid may also be adjusted to help control the temperature of the showerhead assembly 104. Additionally, the wall thicknesses of the heat exchanging channels 141 may be designed to facilitate temperature regulation of various showerhead surfaces. For example, the wall thickness T (see FIG. 2A) of the showerhead face 153 may be made thinner to increase the rate of thermal transfer through the wall and thereby increase the cooling or heating rate of the showerhead face 153.

Control of temperature for various showerhead assembly 104 features, such as mixing channels 150 and showerhead face 153, is desirable to reduce or eliminate formation of condensates on the showerhead assembly 104 as well as reduce gas phase particle formation and prevent the production of undesirable precursor reactant products which may adversely affect the composition of the film deposited on the substrates 140. In one embodiment, one or more thermocouples or other temperature sensors (not shown) may be disposed in proximity to showerhead face 153 to measure a showerhead temperature. The one or more thermocouples or other temperature sensors are disposed near central conduit 148 and/or outer perimeter 504 (see FIG. 5) of showerhead assembly 104. In another embodiment, one or more thermocouples or other temperature sensors are disposed in proximity to heat exchanging channel 141 inlets and outlets. In other embodiments, the temperature sensor is located in proximity to other showerhead assembly 104 features. In other embodiments, the temperature sensor may be located in proximity to other showerhead assembly 104 features.

The temperature data measured by the one or more thermocouples or other temperature sensors may be sent to a controller (not shown) which may adjust the heat exchanging fluid temperature and flow rate to maintain the showerhead temperature within a predetermined range. In one embodiment, the showerhead temperature may be maintained at about 50 degrees Celsius to about 350 degrees Celsius. In another embodiment, the showerhead temperature may be maintained at a temperature of greater than 350 degrees Celsius.

FIG. 2A is a detailed cross sectional view of the showerhead assembly 104 shown in FIG. 1B according to one embodiment of the invention. The first and second precursor gases 154, 155 flow from first and second gas channels 142, 143 into first and second gas injection holes 156, 157 and then into mixing channel 150. The first gas injection hole 156 has diameter D1, and the second gas injection hole 157 has diameter D2. In one embodiment, the diameters D1 and D2 are equal, and may range from about 0.25 mm to about 1.5 mm. In another embodiment, the diameters D1 and D2 of first and second gas injection holes 156, 157 may not be equal. For example, the second gas injection hole 157 which may supply a nitrogen precursor, such as ammonia (NH3), may have a diameter D2 which is greater than diameter D1 for first gas injection hole 156 which may supply a metal organic precursor. The hole diameters D1 and D2 may be selected to facilitate laminar gas flow, avoid gas recirculation, and help provide the desired gas flow rates for first and second precursor gases 154, 155 through first and second gas injection holes 156, 157. In one embodiment, the gas flow rates through each first and second gas injection hole 156, 157 may be approximately equal. The first and second gas injection holes 156, 157 have a separation distance X which may be selected to facilitate gas mixing and minimize gas recirculation.

The first and second precursor gases 154, 155 mix within the mixing channel 150 to form process gas 152. The mixing channel 150 allows the first and second precursor gases 154, 155 to mix partially or fully before entering the processing volume 108, where additional precursor mixing may occur as the process gas 152 flows towards the substrates 140. This "pre-mixing" of the first and second precursor gases 154, 155 within the mixing channel 150 may provide more complete and uniform mixing of the precursors before the process gas 152 reaches the substrates 140, resulting in higher deposition rates and improved film qualities.

Vertical walls 201 of the mixing channel 150 may be formed by the outer or exterior walls of heat exchanging channels 141 which are adjacent to the mixing channel 150. In one embodiment, the mixing channel 150 comprises exterior walls formed by vertical walls 201 which are substantially parallel to each other. The height H of the mixing channel 150 may be measured from channel surface 202 to a corner 203 where the mixing channel 150 terminates and diverging walls 200 begin and extend from corner 203 to showerhead face 153. In one embodiment, the height H of the mixing channel 150 may range from about 7 mm to about 15 mm. In another embodiment, height H of the mixing channel 150 may exceed 15 mm. In one embodiment, the width W1 of the mixing channel 150 may range from about 5 mm to about 20 mm, and the width W2 of the heat exchanging channel 141 may be from about 7 mm to about 13 mm. The distance between the diverging walls 200 may increase in the direction of the substrates 140 so that the surface area of the showerhead face 153 is reduced and the gas flow path widens as the process gas 152 flows downstream. The reduction in surface area of the showerhead face 153 may help reduce gas condensation, and the diverging walls 200 may help reduce gas recirculation as the process gas 152 flows past the heat exchanging channels 141. A diverging angle α may be selected to increase or decrease the surface area of the showerhead face 153 and help reduce gas recirculation. In one embodiment, the angle α is zero degrees. In another embodiment, the angle α is 45 degrees.

Figure 2B:
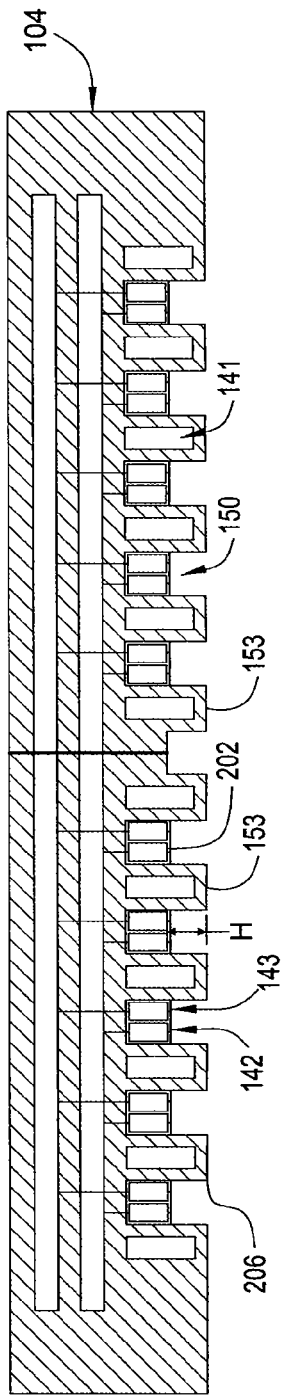
FIGS. 2B-2D are cross sectional views of different embodiments for mixing channels and heat exchanging channels.
Figure 2C:
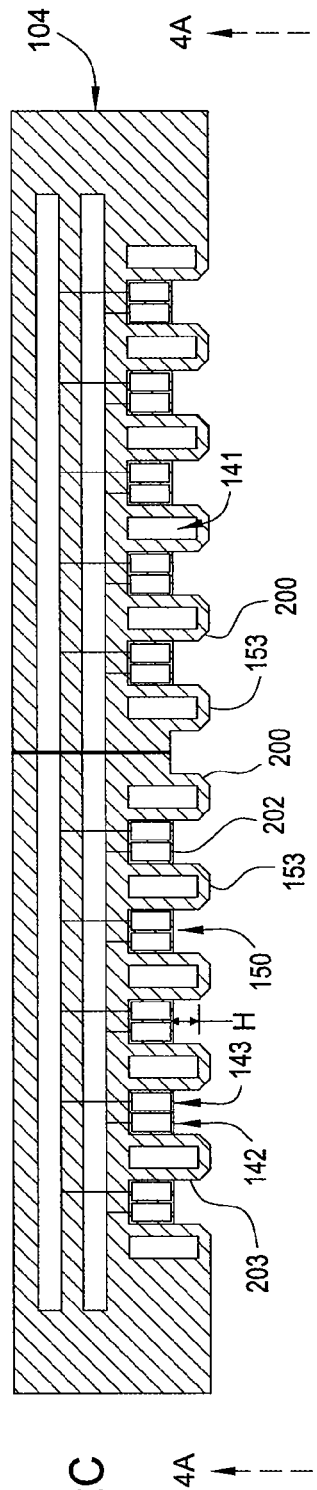
Figure 2D:
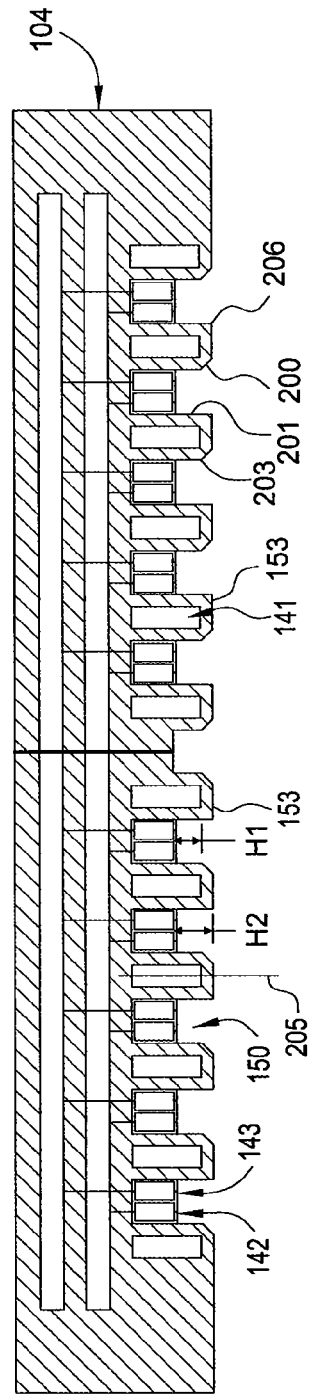

FIGS. 2B-2D are cross sectional views of different embodiments for mixing channels 150 and heat exchanging channels 141. FIG. 2B shows heat exchanging channels 141 that have corners 206 and no diverging walls 200. In this embodiment, the mixing channels 150 have vertical walls 201 which extend from channel surface 202 to showerhead face 153. The absence of diverging walls 200 may result in a greater height H for mixing channel 150 and, hence, greater mixing travel length which may facilitate more complete mixing of the first and second precursor gases 154, 155. FIG. 2C is an embodiment which has been previously described which may place a chamfer, bevel, radius, or other geometrical feature at corner 206 to produce diverging walls 200 at one end of the mixing channel 150 which has height H. Another embodiment is shown in FIG. 2D where vertical walls 201 and diverging walls 200 are both used and are located asymmetrically with respect to a central planes 205 of heat exchanging channels 141. This asymmetric wall configuration may minimize recirculation as process gas 152 flows from showerhead assembly 104 to substrates 140 to annular exhaust channel 105. Heights H1 and H2 are measured from channel surface 202 to corners 203 and 206 respectively. The heights H1 and H2 may be used to characterize an effective length for the mixing channel 150.

Figure 2E:
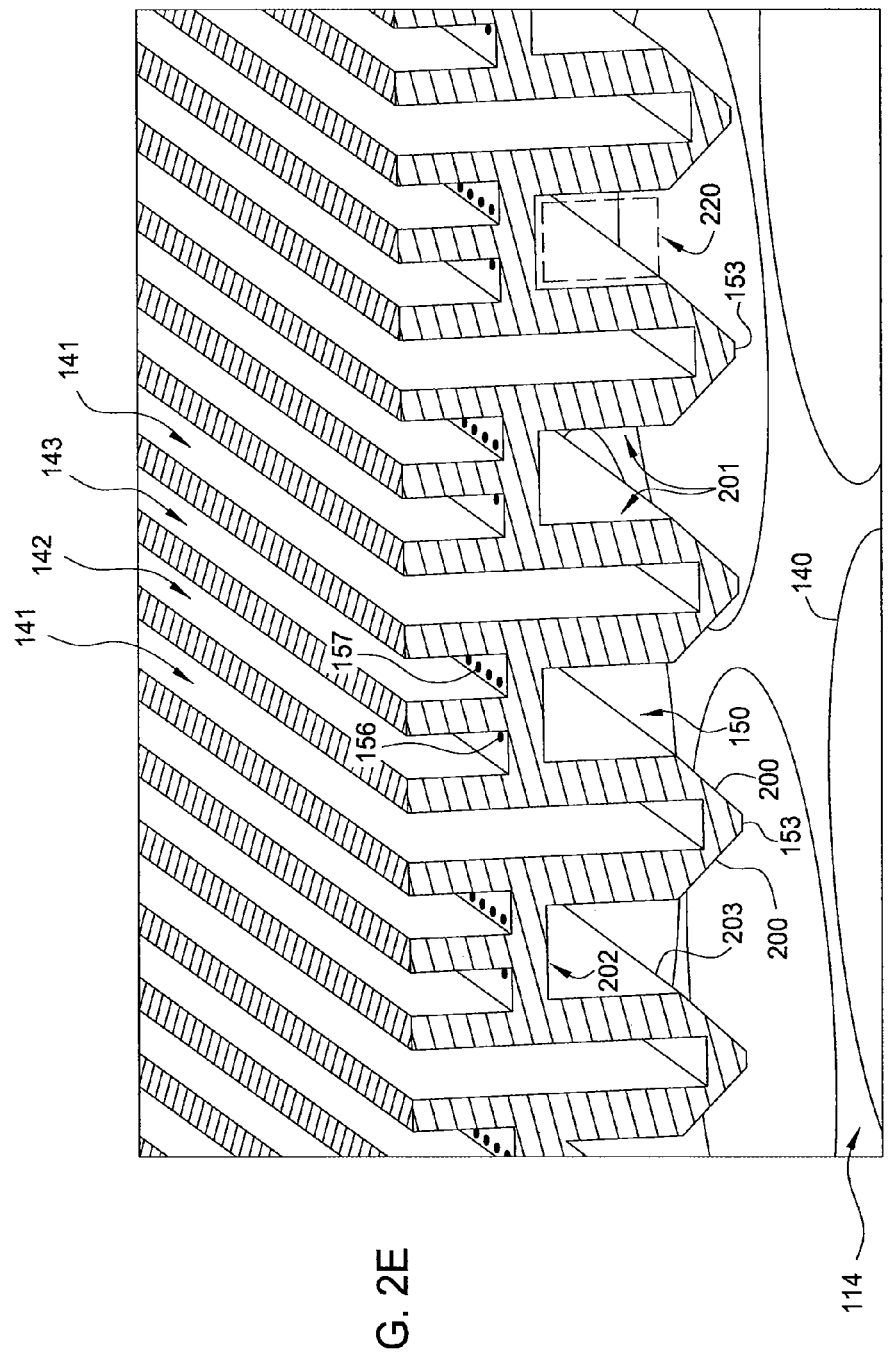
FIG. 2E is a cross sectional perspective cut-away view of mixing channels and heat exchanging channels according to one embodiment of the invention.

FIG. 2E is a cross sectional perspective cut-away view of the mixing channels 150 and heat exchanging channels 141 according to one embodiment of the invention. The first and second gas channels 142, 143 may be straight, parallel channels which extend over and across the substrate carrier 114 which supports one or more substrates 140. At the bottom of each first and second gas channel 142, 143 are a plurality of first and second gas injection holes 156, 157 which are in fluid communication with the first and second gas channels 142, 143 to the mixing channel 150. In one embodiment, the first and second gas injection holes 156, 157 may comprise drilled holes which are disposed near corners of the first and second gas channels 142, 143. In one embodiment, the mixing channels 150 have substantially rectangular cross sections 220. Heat exchanging channels 141 are disposed at each side of the mixing channels 150 to form vertical walls 201 and diverging walls 200. Heat exchanging fluid may flow through the heat exchanging channels 141 to help control the temperature of mixing channels 150, showerhead face 153, and other showerhead assembly 104 features.

Figure 2F:
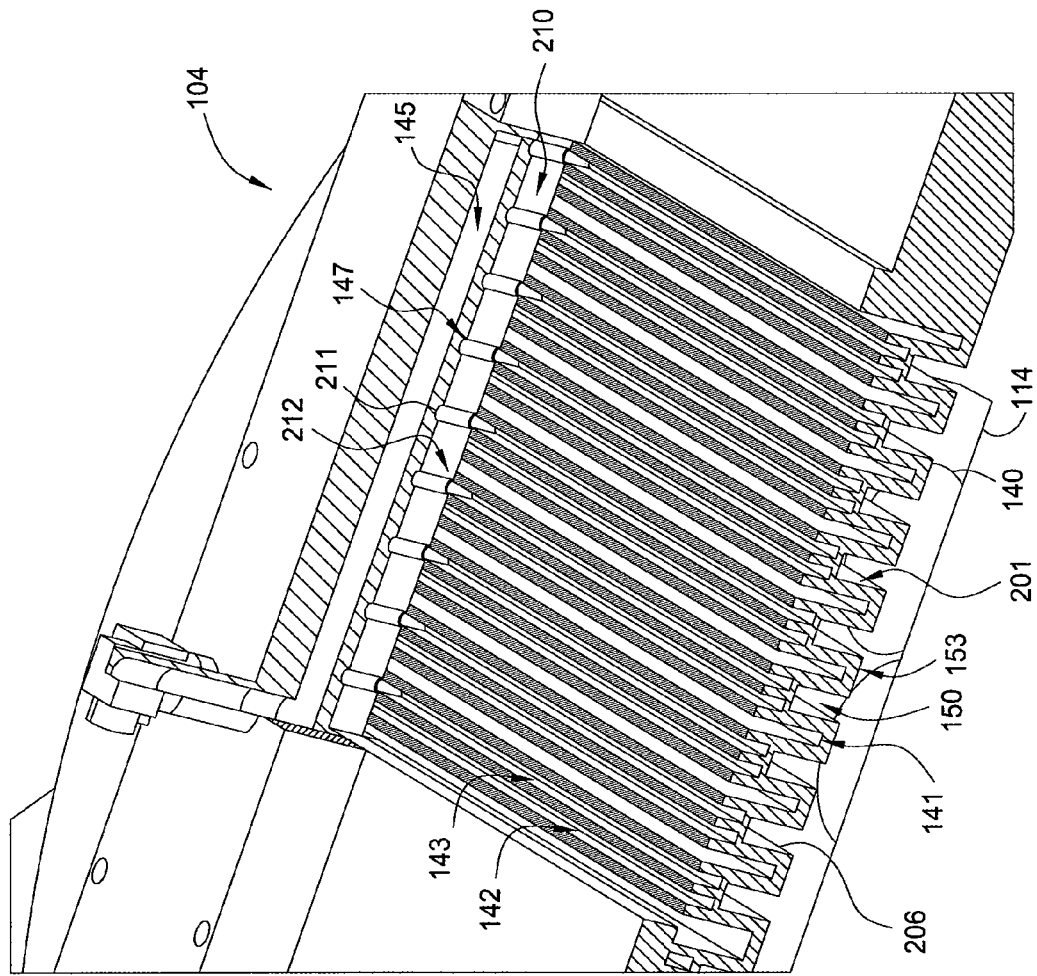
FIG. 2F is a cross sectional perspective cut-away view of a showerhead assembly according to one embodiment of the invention.

FIG. 2F is a cross sectional perspective cut-away view of the showerhead assembly 104 according to one embodiment of the invention. The showerhead assembly 104 comprises a plurality of straight and parallel channels which extend over and across substrate carrier 114. A second plenum 145 is disposed above a plate 210 which comprises a plurality of gas conduits 147 which provide fluid communication between each second gas channel 143 and second plenum 145. Although only one gas conduit 147 is shown for each second gas channel 143 in FIG. 2F, more than one gas conduit 147 may connect to and provide fluid communication between each second gas channel 143 and second plenum 145. The gas conduits 147 may comprise holes 211 formed in plate 210 and tubes 212 which connect to and provide fluid communication between each second gas channel 143 and second plenum 145 and thereby fluidly isolate the second gas channels 143 from the first gas channels 142. A first plenum 144 (see FIG. 2G) may be disposed below plate 210 and may be in direct fluid communication with first gas channels 142 without using gas conduits 146. In another embodiment, gas conduits 146 may be used to connect to and provide fluid communication between first gas channels 142 and first plenum 144, and more than one gas conduit 146 may couple each first gas channel 142 to first plenum 144. FIG. 2F shows one embodiment in which vertical walls 201 extend to showerhead face 153. In another embodiment, diverging walls 200 may extend from the mixing channels 150 to showerhead face 153.

Figure 2G:
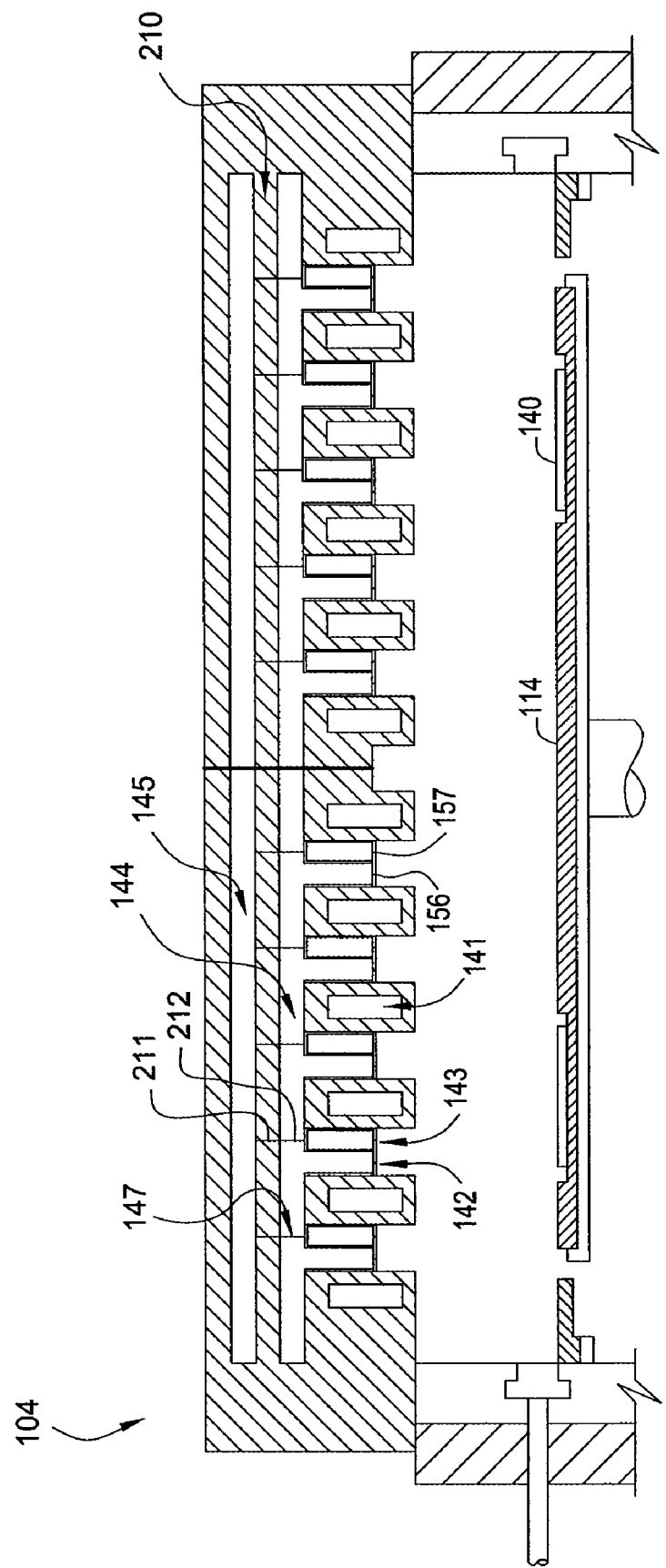
FIG. 2G is a cross sectional view of the gas channels and plenums shown in FIG. 2F according to one embodiment of the invention.

FIG. 2G is a cross sectional view of the gas channels and plenums shown in FIG. 2F according to one embodiment of the invention. The first gas channels 142 open directly to first plenum 144 and gas conduits 146 are not used, and second gas channels 143 are coupled to second plenum 145 by tubes 212 and holes 211 formed in plate 210. The second gas channels 143 are enclosed to prevent fluid communication with first gas channels 142 and thereby prevent mixing of precursor gases prior to gas injection.

In one embodiment, a metal organic (MO) precursor such as trimethyl gallium ("TMG"), trimethyl aluminum ("TMAl"), and/or trimethyl indium ("TMI") may be supplied to first plenum 144 and first gas channels 142, but other suitable MO precursors may also be used. A Group V precursor, such as ammonia ($NH_3$), may be delivered to second plenum 145 and second gas channels 143. In another embodiment, the precursor delivery may be switched so that an MO precursor is supplied to second plenum 145 and a Group V precursor is supplied to first plenum 144.

The showerhead assembly 104 may be designed so that it may be disassembled to facilitate cleaning and part replacement. Materials which may be compatible with the processing environment and may be used for the showerhead assembly 104 include 316L stainless steel, Inconel®, Hastelloy®, electroless nickel plated aluminum, pure nickel, molybdenum, tantalum and other metals and alloys resistant to degradation and deformation from high temperatures, thermal stress, and reaction from chemical precursors. To help reduce assembly complexity and ensure isolation of the different gases and liquids which flow through the assembly, electroforming may also be used to fabricate various parts of the showerhead assembly 104. Such electroformed parts may reduce the number of parts and seals required to isolate the different gases and liquids within the assembly. Additionally, electroforming may also help reduce fabrication costs for those parts which have complex geometries.

FIGS. 3A and 3B are cross sectional views of additional embodiments of the showerhead assembly 104 according to the present invention. The apparatus 100 may be adapted to provide additional gas sources and gas supply lines to enable the additional embodiments of the showerhead assembly 104 described herein. FIG. 3A depicts a showerhead assembly 104 which has a third plenum 306 and third gas channels 304 which are connected by gas conduit 307 so that another gas may be delivered to the mixing channel 150. The gas may be a different precursor gas or inert gas (such as $N_2$, He, Ar, for example). The gas may be injected into the mixing channel 150 via third gas injection holes 305.

Additionally, the gases may be delivered to any one of the first, second and third plenums 144, 145, 306 to form a plurality of possible gas injection sequences. For example, the first gas injection hole 156 may inject an MO precursor, the second gas injection hole 157 may inject a nitrogen precursor, such as NH$_3$, and the third gas injection hole 305 may inject a third precursor gas for a gas injection sequence of MO—NH$_3$-(third precursor)-repeat where "repeat" indicates that the gas injection sequence is repeated across the showerhead assembly 104. In another embodiment, the gases may be delivered to the first, second and third plenums 144, 145, 306 to create the gas injection sequence NH$_3$-MO-(third precursor)-repeat. It is to be understood that the gases are injected simultaneously and the term "gas injection sequence" refers to a spatial and not a temporal sequence. In other embodiments, the showerhead assembly 104 may comprise any number of plenums and gas channels to deliver a plurality of gases in any desired gas injection sequence to the chamber 102.

FIG. 3B is another embodiment of showerhead assembly 104. The mixing channels 150 have been removed to form a substantially flat surface for the showerhead face 153 which comprises a plurality of first, second, and third gas injection holes 302, 311, and 312 which are connected to and in fluid communication with first, second, and third gas channels 308, 309, and 310, which in turn are connected to and in fluid communication with gas conduits 316, 317, 318 and first, second, and third plenums 313, 314, and 315. In one embodiment, the first, second and third gas injection holes 302, 311, 312 may all have the same diameter D1. In other embodiments, the first, second, and third gas injection holes 302, 311, 312 may have different diameters. Different embodiments for the gas injection hole diameter D1 have been previously described herein.

Heat exchanging channels 141 may be disposed between the first, second, and third gas channels 308, 309, and 310. In one embodiment, the heat exchanging channels 141 may be disposed between gas channel sequences as shown in FIG. 3B for the four channel sequence 310-308-310-309-repeat. In one embodiment, heat exchanging channels 141 may be disposed between each gas channel. In another embodiment, the showerhead assembly 104 may have no heat exchanging channels 141 disposed between gas channels. In other embodiments, the showerhead assembly 104 may comprise any number of plenums, heat exchanging channels, gas channels, and gas injection holes to deliver a plurality of gases to the chamber 102.

For some types of precursors and under certain process conditions, it may be desirable to prevent mixing the precursors prior to reaching the substrate 140 deposition surface to prevent premature reaction of the precursors and the production of undesirable particulates and reaction products. In one embodiment, "curtains" of inert gas, such as N$_2$, He, Ar or combinations thereof, for example, may be used to help keep the precursors separated before reaching the substrates 140. For example, gases may be delivered to the appropriate first, second, and third plenums 313, 314, 315 so that third gas injection hole 312 may inject an inert gas N$_2$, first gas injection hole 302 may inject a metal organic (MO) precursor, and second gas injection hole 311 may inject a nitrogen precursor, such as NH$_3$, to form a gas injection sequence N$_2$-MO—N$_2$—NH$_3$-repeat. The inert gas, N2, flows between the precursor gases MO and NH3 to keep the gases separated and prevent premature reaction of the precursors. Another possible gas injection sequence is N$_2$—NH$_3$—N$_2$-MO-repeat. It is to be understood that the showerhead assembly 104 may be adapted to include any number of plenums and gas channels to enable the desired gas injection sequence. Other gas injection sequences which may be used are MO—N2-NH3-repeat; N$_2$-MO—N$_2$—NH$_3$—N$_2$-repeat; and MO—NH$_3$-repeat. It is also to be understood that other precursor gases and other inert gases may be used to enable the desired gas injection sequence. In another embodiment, no inert gases may separate the precursors.

Figure 4A:
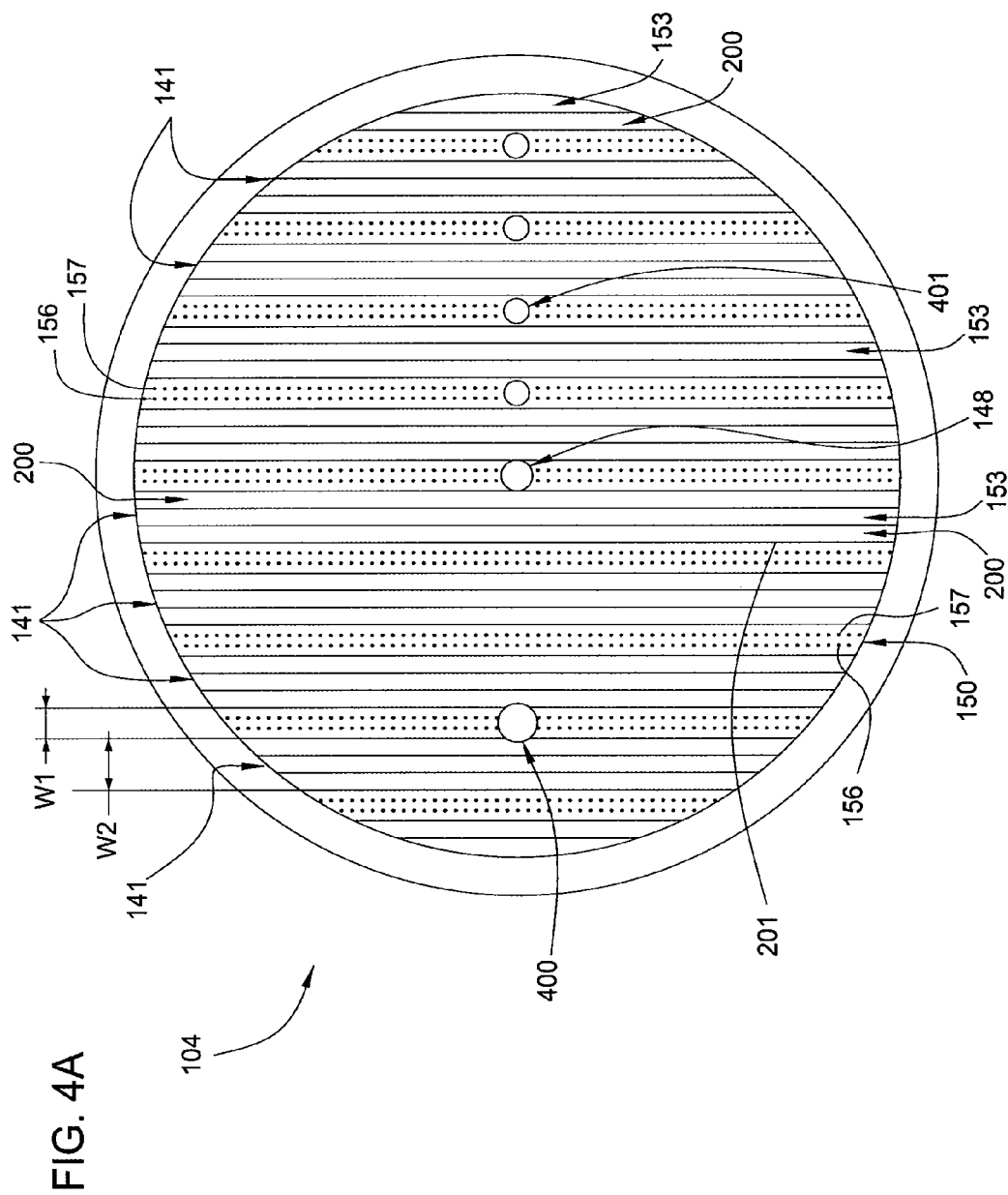
FIG. 4A is a schematic bottom view of the showerhead assembly shown in FIGS. 2C and 2E according to one embodiment of the present invention.

FIG. 4A is a schematic bottom view of the showerhead assembly shown in FIGS. 2C and 2E according to one embodiment of the present invention. The straight channel geometry of showerhead assembly 104 is reflected by the linear arrangement of the first and second gas injection holes 156 and 157 which are disposed at the bottom of first and second gas channels 142, 143. The first and second gas injection holes 156, 157 form two columns which repeat and correspond to a repeating two gas channel sequence 142-143-repeat Mixing channels 150 comprise straight and parallel channels which are recessed from showerhead face 153 and have vertical walls 201 and diverging walls 200. Heat exchanging channels 141 comprise straight and parallel channels having width W2 and are disposed between the mixing channels 150 having width W1. The mixing channels 150 are parallel to the heat exchanging channels 141.

A central conduit 148 is located at or near the center of the showerhead assembly 104, and several embodiments for the central conduit 148 have been previously described herein. One or more ports 400 and 401 may be disposed about the central conduit 148, and the port 400 and 401 diameters may be the same or different depending upon the intended function of each port 400 and 401. In one embodiment, the ports 400 and/or 401 may be used to house temperature sensors such as pyrometers or thermocouples to measure substrate temperature and/or other temperatures, such as the temperature of the showerhead face 153. In one embodiment, the ports 400 and 401 may be disposed on the showerhead assembly 104 to avoid intersecting with the heat exchanging channels 141.

In another embodiment, the ports 400 and/or 401 may be used as metrology ports and may be coupled to one or more metrology tools (not shown). The metrology tool may be used to measure various film properties, such as real time film growth, thickness, roughness, composition, or other properties. One or more ports 400 and 401 may also be angled to enable use of a metrology tool, such as for reflectance measurements which may require an angled emitter and receiver for a reflected laser beam, for example.

Each port 400 and 401 may also be adapted to flow a purge gas (which may be an inert gas) to prevent condensation on devices within ports 400 and 401 and enable accurate in situ measurements. The purge gas may have annular flow around a sensor, probe, or other device which is disposed inside tube sensor 301 and adjacent to port 400, 401. In another embodiment, the ports 400, 401 may have a diverging nozzle design so that the purge gas flow path widens as the gas moves downstream towards substrates 140. The diverging nozzle may be a countersink, chamfer, radius or other feature which widens the gas flow path. In one embodiment, the purge gas may have a flow rate of about 50 sccm (standard cubic centimeters per minute) to about 500 sccm.

Figure 4B:
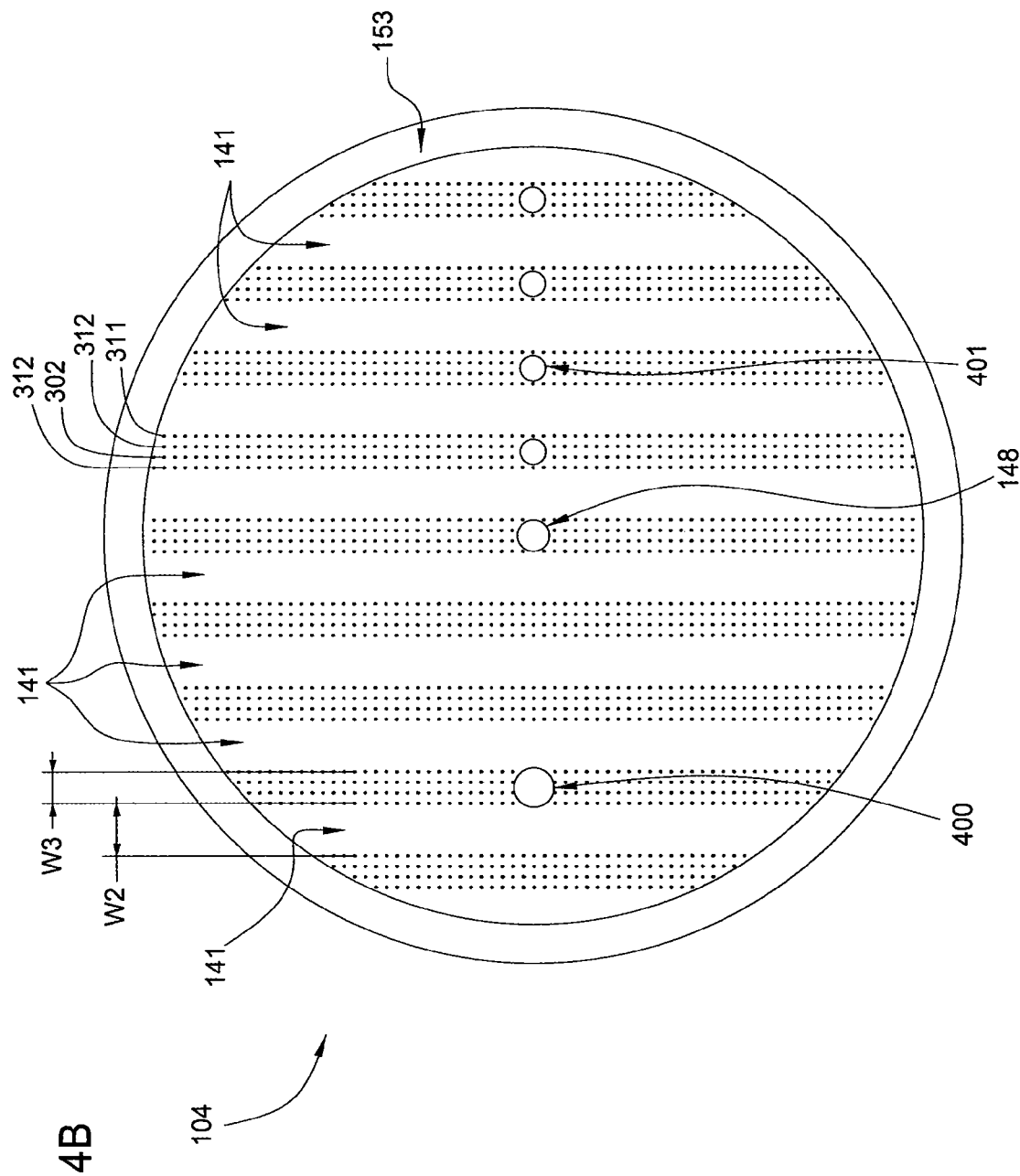
FIG. 4B is a schematic bottom view of the showerhead assembly shown in FIG. 3B according to one embodiment of the present invention.

FIG. 4B is a schematic bottom view of the showerhead assembly 104 shown in FIG. 3B according to one embodiment of the present invention. A plurality of first, second, and third gas injection holes 302, 311, and 312 are disposed on a substantially flat showerhead face 153 and are separated by heat exchanging channels 141. The first, second, and third gas injection holes 302, 311, and 312 form four columns which repeat and correspond to a repeating four gas channel sequence 310-308-310-309-repeat. The gas injection hole columns may have an overall width W3, and the heat exchanging channels 141 may have an approximate width W2. In one embodiment, the ports 400 and 401 may be disposed on the showerhead face 153 to avoid intersecting with the heat exchanging channels 141. Various embodiments for ports 400, 401 have been previously described herein.

Figure 5:
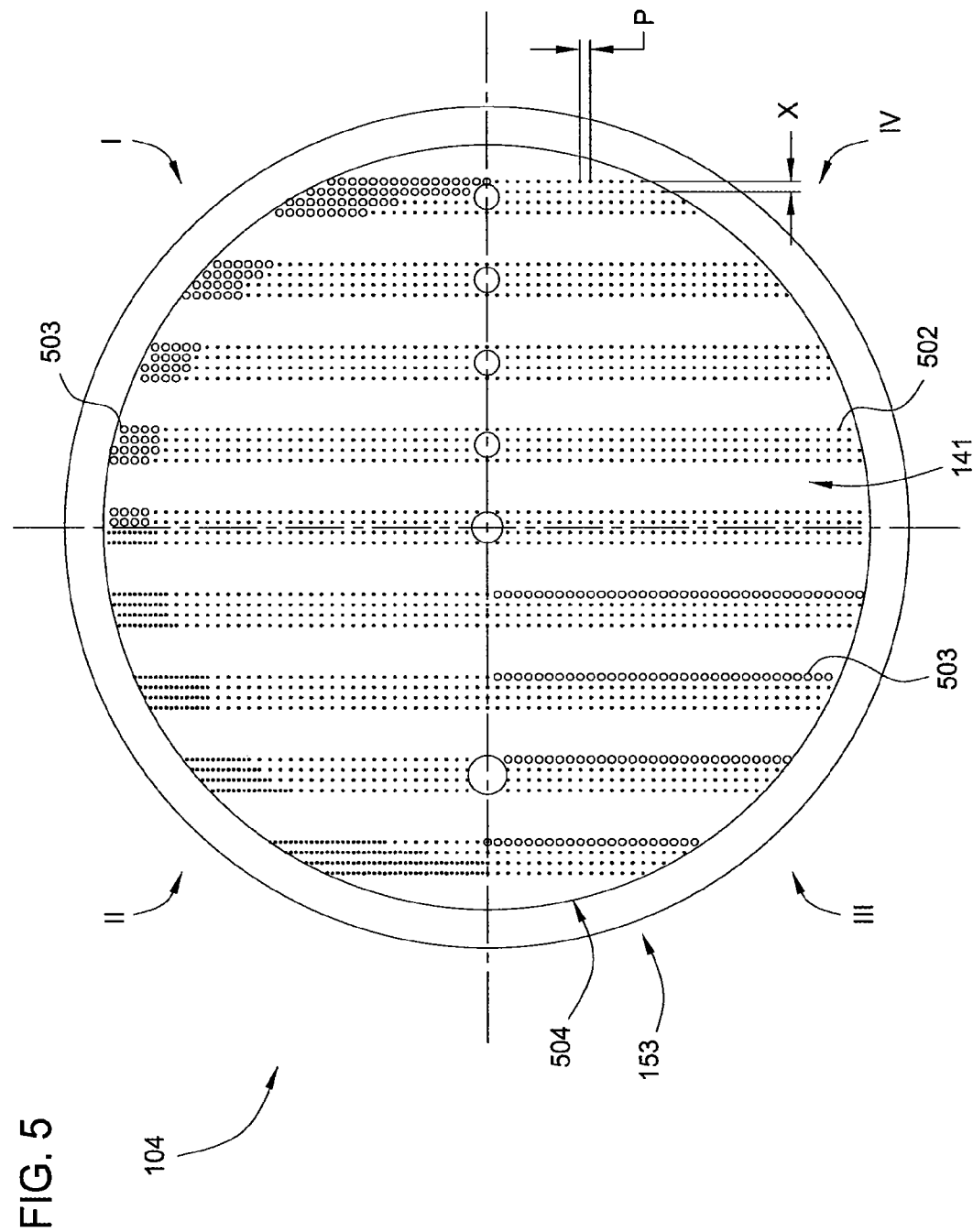
FIG. 5 is a schematic bottom view of additional embodiments of a showerhead assembly according to the present invention.

FIG. 5 is a schematic bottom view of additional embodiments for a showerhead assembly 104 according to the present invention. A plurality of gas injection holes 502 are in fluid communication with straight gas channels, such as first and second gas channels 142, 143, although in this example four channels are used for each gas channel sequence. Heat exchanging channels 141 may be disposed between the gas channel sequences.

In one embodiment, as shown in quadrant IV, the same-sized gas injection holes 502 may be used across showerhead face 153. Each gas channel may supply a different gas, such as an MO precursor, nitrogen precursor, or inert gas, for example, to the gas injection holes 502 which are coupled to the gas channel. The gas channel dimensions (such as length and width) and number and locations of gas conduits 316, 317, 318 for each gas channel may be selected to help achieve proportional gas flow so that approximately the same amount of gas over time is delivered to each gas channel which delivers the same precursor (or inert gas). The diameters of the gas injection holes 502 may be suitably sized to help ensure that the gas flow rate is about the same through each gas injection hole 502 along each gas channel which flows the same precursor. Mass flow controllers (not shown) may be disposed upstream of the showerhead assembly 104 so that the flow rate of each precursor to the gas channels may be adjusted and thereby control the precursor stochiometry of process gas 152. However, under certain conditions, it may also be desirable to increase or decrease the process gas 152 flow rate at various locations along the showerhead face 153.

In one embodiment, shown in quadrant I, larger gas injection holes 503 having diameters greater than the diameters of gas injection holes 502 may be used near the outer perimeter 504 of the showerhead assembly 104 to help compensate for gas flow anomalies which may exist near the annular exhaust channel 105 and outer edges of the substrate carrier 114. For example, the vacuum of the annular exhaust channel 105 may deplete the process gas 152 near outer perimeter 504 and larger gas injection holes 503 may help compensate for the gas depletion.

Quadrant II shows another embodiment which uses a greater hole density (number of holes per unit area) for gas injection holes 502 near the outer perimeter 504 of the showerhead assembly 104 which may help provide more uniform gas distribution over substrates 140. A pitch P is the shortest distance between gas injection holes 502 along the same gas channel 501, and separation distance X is the shortest distance between gas injection holes 502 disposed in adjacent gas channels 501. The pitch P may be changed to increase or decrease the hole density over desired areas of the showerhead assembly 104. In the present embodiment, the pitch P is decreased to increase the hole density near outer perimeter 504 while separation distance X remains unchanged. In other embodiments, separation distance X and/or the dimensions of the gas channels 501 may also be changed to increase or decrease the hole density.

In yet another embodiment, shown in quadrant III, larger gas injection holes 503 may be used for one or more precursors and/or inert gases to help achieve the desired gas flow, gas distribution and/or gas stochiometry across showerhead face 153. In other embodiments, the gas injection hole 502 diameters and hole densities may be varied as desired across showerhead assembly 104. The embodiments shown in FIG. 5 and described herein may be combined and used with other embodiments described herein for showerhead assembly 104.

In the embodiments previously discussed herein, a plurality of gas injection holes have been disposed along the lengths of straight gas channels to inject gases along a plurality of straight lines, as shown in FIGS. 2E, 4A, and 4B. A gas channel sequence may comprise two or more adjacent channels which may carry precursor gases and inert gases to form a gas injection sequence, such as $N_2$-MO—$N_2$—$NH_3$ for example, which repeats across the showerhead assembly 104. The gas injection holes for each gas channel form a linear gas injection zone which injects the precursor gas or inert gas carried by the channel. The gas injection zones are straight lines and the gas injection sequence may refer to the sequence of gases of the gas injection zones which may repeat across the showerhead assembly 104. In other embodiments, the gas injection zones may have other shapes.

Figure 6A:
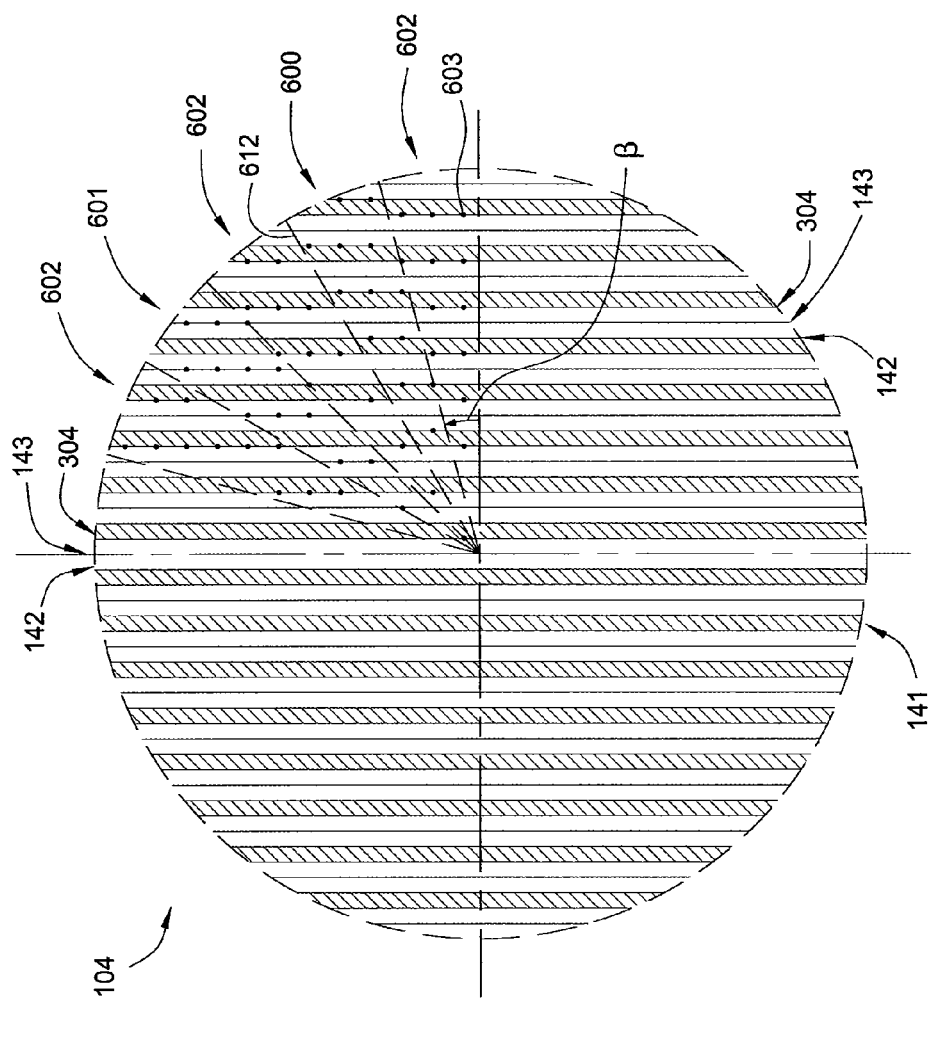
FIGS. 6A and 6B are schematic bottom views of a showerhead assembly which show different embodiments for gas injection zones.
Figure 6B:
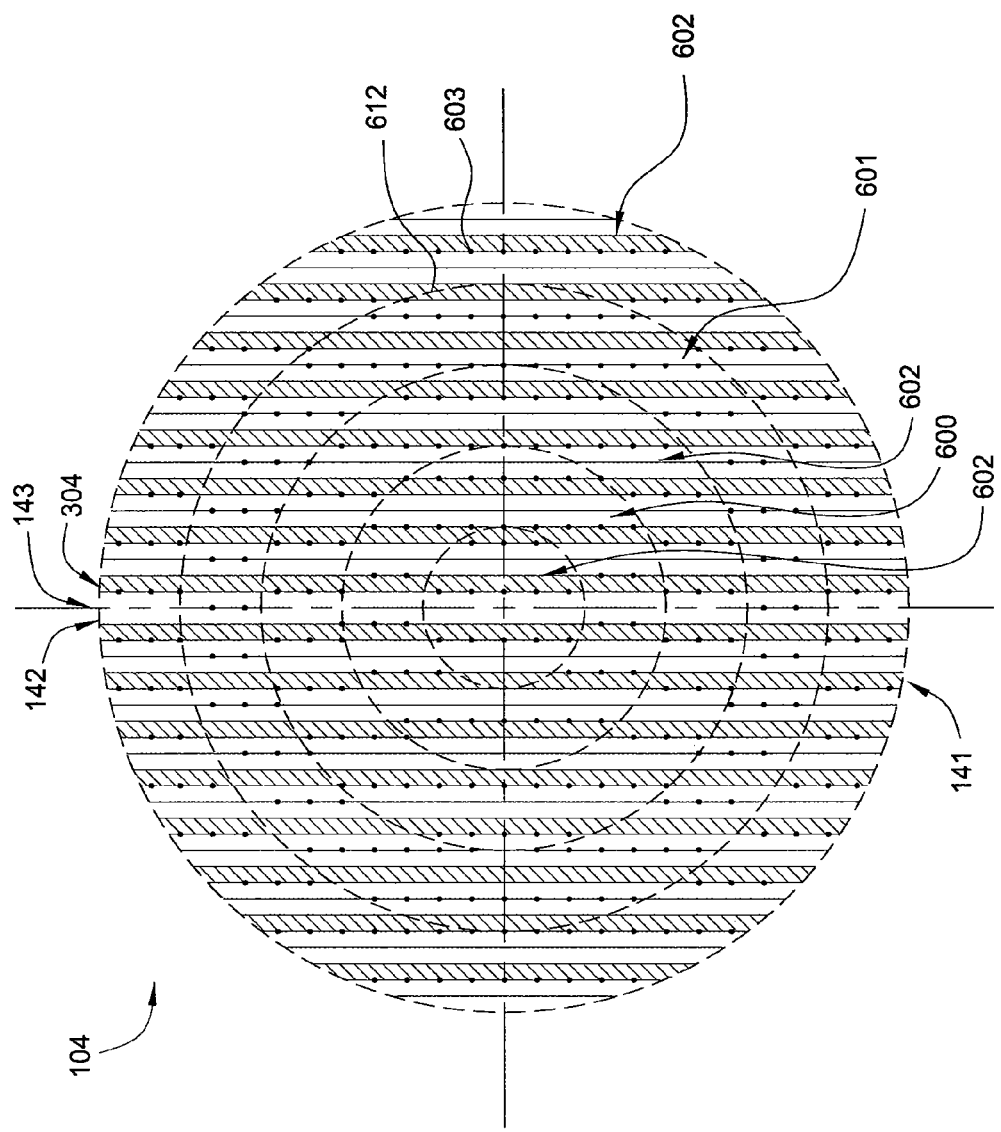

FIGS. 6A and 6B are schematic bottom views of a showerhead assembly 104 which show different embodiments for gas injection zones. FIG. 6A depicts a plurality of gas injection holes 603 which are in fluid communication with first, second, and third gas channels 142, 143, 304 for showerhead assembly 104. For clarity, the first, second, and third gas channels 142, 143, 304 are represented by straight lines and the cross-hatching represents areas which may include heat exchanging channels 141. The three channel gas channel sequence is 142-143-304-repeat. In other embodiments, a plurality of gas channels may be used for the gas channel sequence. Each of the first, second, and third gas channels 142, 143, 304 may supply a different gas, such as an MO precursor, nitrogen precursor, or inert gas, for example, to the gas injection holes 603 which are coupled to each gas channel.

The gas injection holes 603 may be suitably located along each of the first, second, and third gas channels 142, 143, 304 to form gas injection zones 600, 601, and 602 having boundaries indicated by dashed lines 612. By suitably locating the gas injection holes 603 along the gas channels, many gas injection zone shapes are possible using straight gas channels. Additionally, the choice of first, second, or third gas channels 142, 143, or 304 for gas injection hole 603 location within each gas injection zone provides several possible gas injection sequences. Further, the gas injection holes 603 may be suitably spaced along the gas channels to optimize the gas flow distribution for each gas injection zone. In this example, the zones are wedge shaped and shown only for one quadrant of showerhead assembly 104.

Each gas injection zone 600, 601, and 602 may supply a different gas to the processing chamber 102. For example, gas injection zone 602 comprises gas injection holes 603 which are connected to and in fluid communication with (e.g., using drilled holes) only third gas channels 304; gas injection zone 600 comprises gas injection holes 603 which are connected to and in fluid communication with only first gas channels 142; and gas injection zone 601 comprises gas injection holes 603 which are connected to and in fluid communication with only second gas channels 143.

In one embodiment, first gas channel 142 may supply an MO precursor, second gas channel 143 may supply a nitrogen precursor such as ammonia ($NH_3$), and third gas channel 304 may supply an inert gas, such as nitrogen ($N_2$), to form a gas injection sequence N2-MO—N2-NH3-repeat which corresponds to gas injection zones 602-600-602-601-repeat. In other embodiments, any number of gas injection sequences and zones may be formed by a suitable choice of gas injection hole 603 locations, the number of different gas channels used, and the number of different gases used. The angle β for each wedge shaped zone may be suitably chosen for the desired number of repeated gas injection sequences and desired zone sizes within 360 degrees for showerhead assembly 104. In the present embodiment, the gas injection zones 600, 601, and 602 are wedge shaped, but the gas injection hole 603 locations may be adapted to form many other zone shapes.

FIG. 6B shows another embodiment for gas injection zones 600, 601, and 602 shaped as concentric rings. The gas injection holes 603 may be suitably located along each first, second, and third gas channel 142, 143, 304 to form concentric gas injection zones 600, 601, and 602 having boundaries indicated by dashed lines 612. As described above, a gas injection sequence N2-MO—N2-NH3-repeat (from center zone to outer zone) which corresponds to concentric gas injection zones 602-600-602-601-repeat may be formed, but other gas injection sequences are possible. The embodiments shown in FIGS. 6A and 6B and described herein may be combined and used with other embodiments described herein for showerhead assembly 104. Additionally, the gas injection hole 603 diameters and hole densities may be varied as desired within each gas injection zone.

The previous showerhead assembly 104 embodiments described herein for MOCVD applications may be adapted for use in another deposition technique known as hydride vapor phase epitaxy (HVPE). The HVPE process offers several advantages in the growth of some Group III-V films, GaN in particular, such as high growth rate, relative simplicity, and cost effectiveness. In this technique, the growth of GaN proceeds due to the high temperature, vapor phase reaction between gallium chloride (GaCl) and ammonia ($NH_3$). The ammonia may be supplied from a standard gas source, while the GaCl is produced by passing a hydride-containing gas, such as HCl, over a heated liquid gallium supply. The two gases, ammonia and GaCl, are directed towards a heated substrate where they react to form an epitaxial GaN film on the surface of the substrate. In general, the HVPE process may be used to grow other Group III-nitride films by flowing a hydride-containing gas (such as HCl, HBr, or HI) over a Group III liquid source to form a Group III-halide gas, and then mixing the Group III-halide gas with a nitrogen-containing gas such as ammonia to form a Group III-nitride film.

In one embodiment, the gas delivery system 125 may comprise a heated source boat (not shown) external to chamber 102. The heated source boat may contain a metal source (e.g., Ga) which is heated to the liquid phase, and a hydride-containing gas (e.g., HCl) may flow over the metal source to form a Group III-halide gas, such as GaCl. The Group III-halide gas and a nitrogen-containing gas, such as $NH_3$, may then be delivered to first and second plenums 144, 145 of showerhead assembly 104 via supply lines 131, 132 for injection into the processing volume 108 to deposit a Group III-nitride film, such as GaN, on substrates 140. In another embodiment, one or more supply lines 131, 132 may be heated to deliver the precursors from an external boat to chamber 102. In another embodiment, an inert gas, which may be hydrogen, nitrogen, helium, argon or combinations thereof, may be flowed between first and second HVPE precursor gases to help keep the precursors separated before reaching the substrates 140. The HVPE precursor gases may also include dopant gases.

In addition to the Group III precursors previously mentioned herein, other Group III precursors may be used with showerhead assembly 104. For example, precursors having the general formula $MX_3$ where M is a Group III element (e.g., gallium, aluminum, or indium) and X is a Group VII element (e.g., bromine, chlorine or iodine) may also be used (e.g., $GaCl_3$). Components of the gas delivery system 125 (e.g., bubblers, supply lines) may be suitably adapted to deliver the $MX_3$ precursors to showerhead assembly 104.

While the foregoing is directed to embodiments of the present invention, other and further embodiments of the invention may be devised without departing from the basic scope thereof, and the scope thereof is determined by the claims that follow.

The invention claimed is:

1. A showerhead apparatus comprising:
a first plenum disposed within the showerhead;
a second plenum disposed within the showerhead;
a plurality of first gas flow channels formed within the showerhead and in fluid communication with the first plenum;
a plurality of second gas flow channels formed within the showerhead and in fluid communication with the second plenum, wherein the first plenum is disposed between the second plenum and the first and second gas flow channels;
a first plurality of gas conduits formed within the showerhead and coupling the first plenum to the first gas flow channels;
a second plurality of gas conduits formed within the showerhead and coupling the second plenum to the second gas flow channels;
a plurality of first gas injection holes formed within the showerhead and in fluid communication with the first gas flow channels;
a plurality of second gas injection holes formed within the showerhead and in fluid communication with the second gas flow channels; and
mixing channels formed in a surface of the showerhead and disposed downstream from the first and second gas injection holes for mixing a first gas and a second gas injected through the first and second gas injection holes.

2. The apparatus of claim 1, wherein the mixing channels are formed in a surface of the showerhead apparatus which faces a substrate processing volume.

3. The apparatus of claim 1, wherein the mixing channels comprise straight and parallel channels extending across a surface of the showerhead.

4. The apparatus of claim 3, further comprising a plurality of heat exchanging channels formed between the mixing channels.

5. The apparatus of claim 4, wherein the heat exchanging channels are formed within walls that extend in the direction of the gas injection past the first and second gas injection holes toward a substrate processing volume.

6. The apparatus of claim 1, further comprising one or more temperature sensors for measuring the temperature of the showerhead, wherein the flow rate and temperature of heat exchanging fluid that flows through the heat exchanging channels is controlled based on the measured temperature.

7. The apparatus of claim 1, further comprising diverging walls coupled to opposing sides of the mixing channels, wherein a distance between the diverging walls increases in a direction toward a substrate processing volume.

8. The apparatus of claim 1, further comprising a central conduit fluidly isolated from the gas flow channels, plenums, and mixing channels.

9. The apparatus of claim 8, wherein the central conduit is adapted to pass a fluid or a plasma therethrough.

10. The apparatus of claim 8, wherein the central conduit is a port for a metrology tool.

11. The apparatus of claim 8, wherein the central conduit is a port for a temperature sensor.

12. A showerhead apparatus comprising:
a first plenum disposed within the showerhead;
a second plenum disposed within the showerhead;

a plurality of first gas flow channels formed within the showerhead and in fluid communication with the first plenum;

a plurality of second gas flow channels formed within the showerhead and in fluid communication with the second plenum, wherein the first plenum is disposed between the second plenum and the first and second gas flow channels;

a first plurality of gas conduits formed within the showerhead and coupling the first plenum to the first gas flow channels;

a second plurality of gas conduits formed within the showerhead and coupling the second plenum to the second gas flow channels;

a plurality of first gas injection holes formed within the showerhead and in fluid communication with the first gas flow channels;

a plurality of second gas injection holes formed within the showerhead and in fluid communication with the second gas flow channels; and heat exchanging channels disposed between sets of the first and second gas injection holes, and formed within walls that extend in the direction of the gas injection past the first and second gas injection holes toward a substrate processing volume, wherein the exterior of the walls define mixing channels into which a first gas and a second gas are injected through the first and second gas injection holes to be mixed therein.

13. The apparatus of claim 12, wherein the mixing channels are defined on a surface of the showerhead apparatus which faces a substrate processing volume.

14. The apparatus of claim 12, wherein the heat exchanging channels have substantially parallel exterior walls extending in the direction of the gas injection.

15. The apparatus of claim 12, wherein the mixing channels and heat exchanging channels are straight channels extending across a surface of the showerhead.

16. The apparatus of claim 12, wherein the first and second gas injection holes near the perimeter of the showerhead apparatus are larger than the first and second gas injection holes near the center of the showerhead apparatus.

17. The apparatus of claim 12, wherein the density of the first and second gas injection holes near the perimeter of the showerhead apparatus are greater than the density of the first and second gas injection holes near the center of the showerhead apparatus.

18. The apparatus of claim 12, wherein the first and second gas injection holes are arranged to define a plurality of substantially wedge shaped gas injection zones, each gas injection zone for injecting a gas that is different from an adjacent gas injection zone.

19. The apparatus of claim 18, further comprising third gas flow channels, wherein the gas injection zones include first gas injection zones, second gas injection zones, and third gas injection zones, and wherein each of the third gas injection zones is between one of the first gas injection zones and one of the second gas injection zones.

20. The apparatus of claim 19, wherein the first gas comprises a first metal precursor and the second gas comprises a nitrogen precursor, and wherein the third gas comprises an inert gas.

21. The apparatus of claim 12, wherein a portion of the walls increasingly diverge in a direction toward a substrate processing volume.

22. The apparatus of claim 12, further comprising a central conduit fluidly isolated from the gas flow channels, plenums, heat exchanging channels, and mixing channels.

23. The apparatus of claim 22, wherein the central conduit is adapted to pass a fluid or a plasma therethrough.

24. The apparatus of claim 22, wherein the central conduit is a port for a metrology tool.

25. The apparatus of claim 22, wherein the central conduit is a port for a temperature sensor.

* * * * *

UNITED STATES PATENT AND TRADEMARK OFFICE
CERTIFICATE OF CORRECTION

PATENT NO.        : 7,976,631 B2
APPLICATION NO.   : 11/873132
DATED             : July 12, 2011
INVENTOR(S)       : Burrows et al.

It is certified that error appears in the above-identified patent and that said Letters Patent is hereby corrected as shown below:

In the Detailed Description:

Column 7, Line 11, please delete "("TMAI")" and insert --("TMAl")-- therefor;

Column 10, Line 26, please delete "("TMAI")" and insert -- -("TMAl")-- therefor.

Signed and Sealed this
Fourth Day of October, 2011

David J. Kappos
*Director of the United States Patent and Trademark Office*